(12) United States Patent
Inagaki et al.

(10) Patent No.: US 8,004,026 B2
(45) Date of Patent: Aug. 23, 2011

(54) SOLID-STATE IMAGING DEVICE

(75) Inventors: Makoto Inagaki, Nagaokakyo (JP);
Yoshiyuki Matsunaga, Kamakura (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/720,549

(22) Filed: Mar. 9, 2010

(65) Prior Publication Data

US 2010/0165162 A1    Jul. 1, 2010

Related U.S. Application Data

(62) Division of application No. 11/396,485, filed on Apr. 4, 2006, now Pat. No. 7,696,543, which is a division of application No. 10/753,954, filed on Jan. 9, 2004, now abandoned.

(30) Foreign Application Priority Data

Mar. 7, 2003    (JP) ................................. 2003-062282

(51) Int. Cl.
    *H01L 31/062*     (2006.01)
    *H01L 31/113*     (2006.01)

(52) U.S. Cl. ........................................ 257/291; 257/292

(58) Field of Classification Search .................. 257/232, 257/234, 291, 292
See application file for complete search history.

(56) References Cited

U.S. PATENT DOCUMENTS

| | | | |
|---|---|---|---|
| 4,656,361 A | 4/1987 | McIntyre | |
| 5,965,871 A | 10/1999 | Zhou et al. | |
| 6,160,281 A | 12/2000 | Guidash | |
| 6,291,280 B1 | 9/2001 | Rhodes | |
| 6,633,334 B1 | 10/2003 | Sakurai et al. | |
| 6,650,369 B2 | 11/2003 | Koizumi et al. | |
| 6,657,665 B1 | 12/2003 | Guidash | |
| 6,977,684 B1 | 12/2005 | Hashimoto et al. | |
| 7,696,543 B2 | 4/2010 | Inagaki et al. | |
| 2003/0137594 A1 | 7/2003 | Koizumi et al. | |
| 2004/0141076 A1 | 7/2004 | Ueno et al. | |
| 2008/0042175 A1* | 2/2008 | Abe et al. ...................... | 257/292 |

FOREIGN PATENT DOCUMENTS

| | | |
|---|---|---|
| EP | 0 908 957 A2 | 4/1999 |
| EP | 0 926 738 A2 | 6/1999 |
| JP | 9-247537 A | 9/1997 |

(Continued)

OTHER PUBLICATIONS

United States Office Action issued in U.S. Appl. No. 10/753,954 dated Nov. 25, 2009.

(Continued)

*Primary Examiner* — Thien F Tran
(74) *Attorney, Agent, or Firm* — McDermott Will & Emery LLP

(57) ABSTRACT

In each photosensitive cell, a photodiode 101, a transfer gate 102, a floating diffusion layer section 103, an amplifier transistor 104, and a reset transistor 105 are formed in one active region surrounded by a device isolation region. The floating diffusion layer section 103 included in one photosensitive cell is connected not to the amplifier transistor 104 included in that cell but to the gate of the amplifier transistor 104 included in another photosensitive cell adjacent to the one photosensitive cell in the column direction. A polysilicon wire 111 connects the transfer gates 102 arranged in the same row, and a polysilicon wire 112 connects the reset transistors 105 arranged in the same row. For connection in the row direction, only polysilicon wires are used.

16 Claims, 10 Drawing Sheets

FOREIGN PATENT DOCUMENTS

| | | |
|---|---|---|
| JP | 10-93067 A | 4/1998 |
| JP | 11195776 | 7/1999 |
| JP | 11-312800 | 11/1999 |
| JP | 2001-189441 | 7/2001 |
| JP | 2003-046864 | 2/2003 |
| JP | 2003-230055 A | 8/2003 |
| KR | 10-0269602 | 10/2000 |
| WO | WO 94/13017 | 6/1994 |

OTHER PUBLICATIONS

Chinese Office Action issued in Chinese Patent Application No. 200410005238, mailed May 22, 2009.
United States Office Action issued in U.S. Appl. No. 11/529,256, mailed May 29, 2009.
United States Office Action issued in U.S. Appl. No. 10/753,954 dated on Sep. 26, 2006.
IBM Technical Disclosure Bulletin vol. 19, Issue 6, pp. 2262-2265 (TDB-ACC-No. NN76112262), "Logical Arrays with Polysilicon Gate Lines", Nov. 1976.
Japanese Notice of Reasons for Rejection issued in Japanese Patent Application No. JP 2005-356455 dated Mar. 9, 2009.
Korean Office Action issued in Korean Patent Application No. 10-2004-0005362, dated Oct. 28, 2010.
United States Office Action issued in U.S. Appl. No. 12/715,884, mailed Oct. 1, 2010.
United States Notice of Allowance issued in U.S. Appl. No. 12/715,884 dated Jan. 20, 2011.
United States Office Action issued in U.S. Appl. No. 12/720,554, mailed Nov. 26, 2010.

* cited by examiner

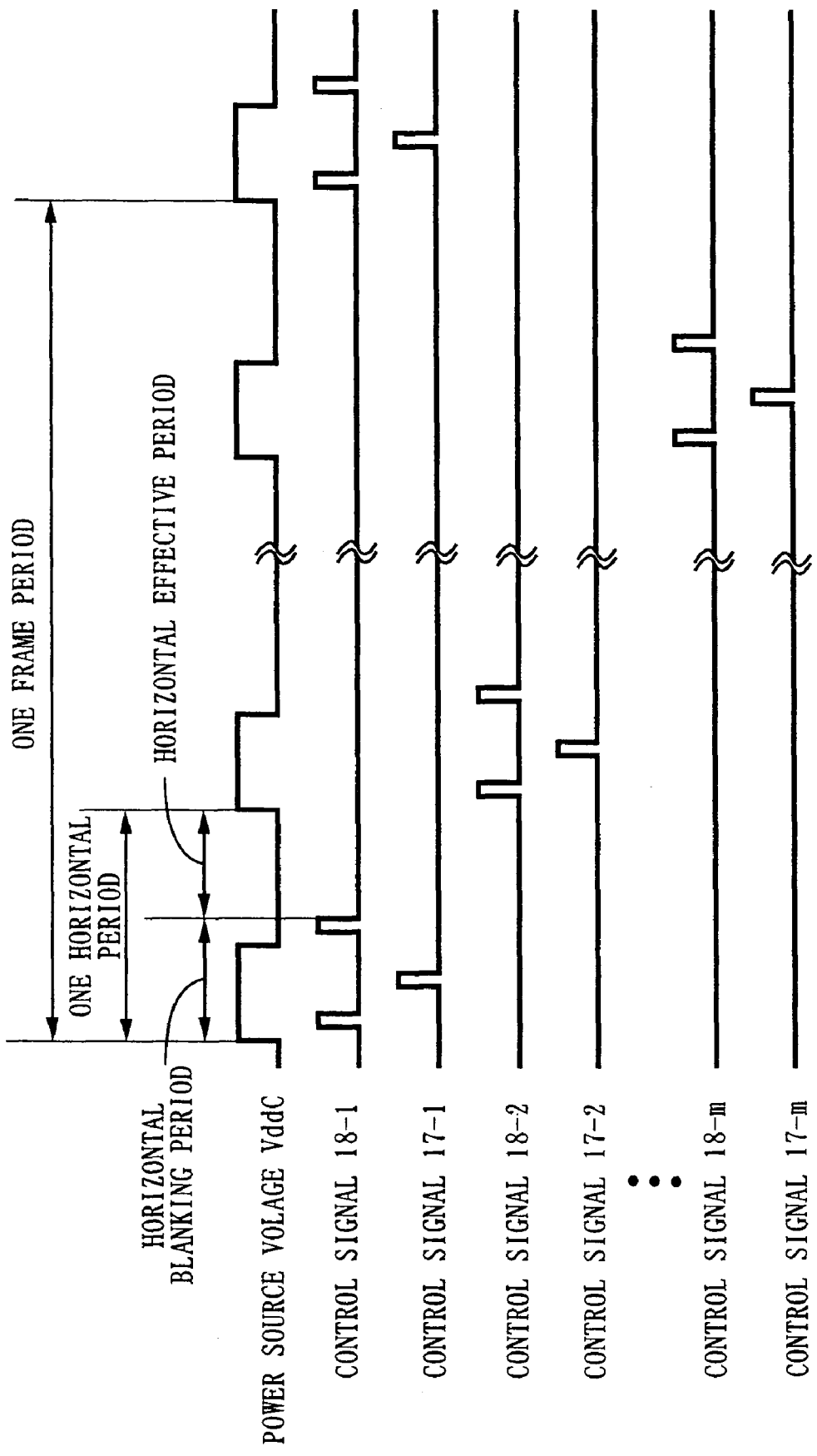

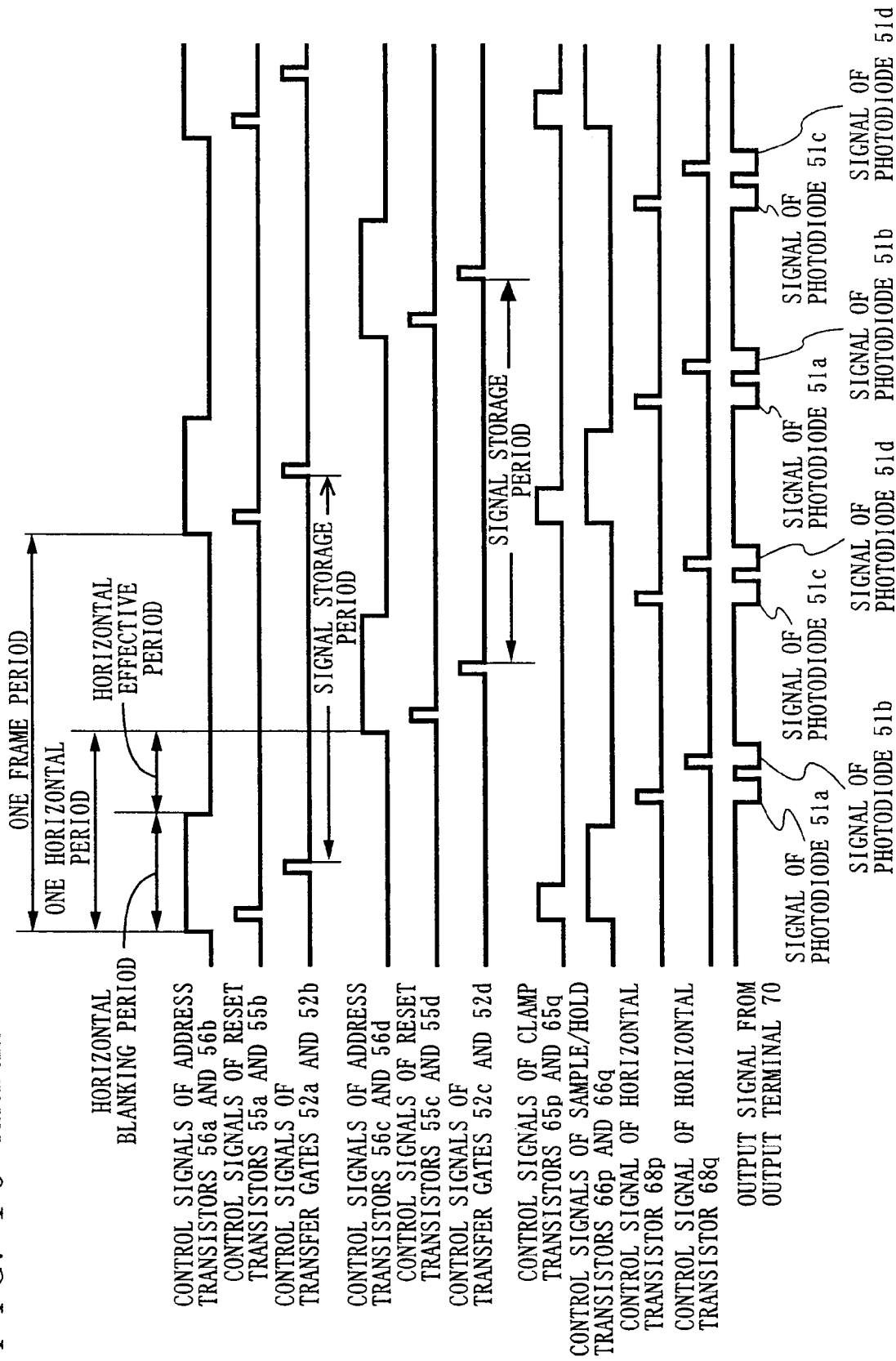

SOLID-STATE IMAGING DEVICE

RELATED APPLICATIONS

This application is a Divisional of U.S. application Ser. No. 11/396,485, filed on Apr. 4, 2006, which is a Divisional of U.S. application Ser. No. 10/753,954, filed on Jan. 9, 2004, claiming priority of Japanese Patent Application No. 2003-062282, filed on Mar. 7, 2003, the entire contents of each of which are hereby incorporated by reference.

BACKGROUND OF THE INVENTION

1. Field of the Invention

The present invention relates to a MOS-type solid-state imaging device to be used for various types of equipment, such as home video cameras, digital still cameras, or cameras incorporated in cellular phones.

2. Description of the Background Art

With reference to FIGS. 9 and 10, a conventional sensor and a scheme of driving the conventional sensor are described below. FIG. 9 is a circuit diagram of the conventional sensor. The sensor illustrated in FIG. 9 includes photosensitive cells (each surrounded by a dotted line) arranged in a 2×2 matrix. Each photosensitive cell includes a photodiode 51, a transfer gate 52, a floating diffusion layer section 53, an amplifier transistor 54, a reset transistor 55, and an address transistor 56. Also, each photosensitive cell corresponds to one pixel for forming an image. Note that, for the purpose of simplifying descriptions, it is assumed herein that the photosensitive cells are arranged in a 2×2 matrix. In practice, however, the photosensitive cells are arranged in a matrix with several tens to thousands of rows and columns. Also, in FIG. 9, the components included in the same photosensitive cell are provided with the same suffix (a through d) for identification.

The scheme of driving the sensor illustrated in FIG. 9 is described below. In order to extract signals from the photosensitive cells on the first row, the address registers 56a and 56b included in the first photosensitive cells on the first row are first controlled by a vertical shift register 61 to be in an ON state. Next, the reset transistors 55a and 55b are controlled also by the vertical shift register 61 to be in an ON state. With this, the floating diffusion layer sections 53a and 53b are reset. At this time, the amplifier transistor 54a and a load transistor 63p form a source follower circuit, producing an output on a vertical signal line 62p. Similarly, the amplifier transistor 54b and a load transistor 63q form a source follower circuit, producing an output on a vertical signal line 62q. Here, voltages appearing on the vertical signal lines 62p and 62q are noise voltages irrespectively of signal electric charges stored in the photodiodes 51a and 51b. Next, the transfer gates 52a and 52b are controlled by the vertical shift register 61 to be in an ON state. Thus, the signal electric charges stored in the photodiodes 5a and 51b are transferred to the floating diffusion layer sections 53a and 53b, causing signal voltages corresponding to the signal electric charges stored in the photodiodes 51a and 51b to appear on the vertical signal lines 62p and 62q.

Clamp capacitors 64p and 64q, clamp transistors 65p and 65q, sample/hold transistors 66p and 66q, and sample/hold capacitors 67p and 67q form a noise suppression circuit. This noise suppression circuit finds a difference between a pixel output with a signal electric charge being applied to the floating diffusion layer section 53 (that is, a signal output) and a pixel output with a signal electric charge not being applied thereto (that is, a noise output). Noise occurring at the sensor illustrated in FIG. 9 mainly includes noise caused by variations in threshold voltage at the amplifier transistor 54 and kTC noise, which is thermal noise occurring at the reset transistor 55. When noise outputs appear on the vertical signal lines 62p and 62q, the clamp transistors 65p and 65q and the sample/hold transistors 66p and 66q are controlled by control terminals 74 and 75 to be in an ON state. Also at this time, the sample/hold capacitors 67p and 67q are applied with a noise-suppressed clamp voltage through a clamp-voltage supply terminal 73. After a predetermined time has elapsed, the clamp transistors 65p and 65q are controlled by the control terminal 74 to be in an OFF state.

Next, voltages each being equal to a sum of the noise-suppressed signal voltage and the noise voltage appear on the vertical signal lines 62p and 62q. With this, the noise voltages on the vertical signal lines 62p and 62q are each changed to the sum of the signal voltage and the noise voltage, and each amount of change corresponds to each noise-suppressed signal voltage. Accordingly, the voltages at the sample/hold side of the clamp capacitors 64p and 64q are also changed by the amount corresponding to the noise-suppressed signal voltage. In practice, the voltages applied to the sample/hold capacitors 67p and 67q are each changed from a noise-suppressed clamp voltage by the amount corresponding to a voltage obtained by dividing the amount of change in the signal voltage on a corresponding one of the vertical signal lines 62p and 62q by a corresponding one of the clamp capacitors and a corresponding one of the sample/hold capacitors. Therefore, the voltage applied to each of the sample/hold capacitors 67p and 67q is the sum of the noise-suppressed clamp voltage and the divided signal voltage, and noise has been suppressed. After the sample/hold transistors 66p and 66q are controlled to be in an OFF state, horizontal transistors 68p and 68q are sequentially and selectively controlled by a horizontal shift register 69 to be in an ON state. With this, signals corresponding to the signal electric charges stored in the photodiodes 51a and 51b are sequentially output from an output terminal 70.

Next, in order to extract signals from the photosensitive cells on the second row, an operation similar to that performed on those on the first row is performed on those on the second row. With this, signals corresponding to the signal electric charges stored in the photodiodes 51c and 51d are output from the output terminal 70.

The above-described operation is illustrated in a timing chart as in FIG. 10. In FIG. 10, a period during which signals stored in one row of the photodiodes 51 are eventually output from the output terminal is called a horizontal effective period, while a period during which signals are output from the photodiode 51 to the vertical signal line 62 for suppression of noise included in the output signals is called a horizontal blanking period. Furthermore, the horizontal blanking period and the horizontal effective period are collectively called a horizontal period. The horizontal period is a time period actually required for reading signals of one row. A time period required for reading signals from the entire sensor is called one frame period. As illustrated in FIG. 10, the amount of signal electric charge stored in the photodiode 51 depends on a time interval of a transfer pulse being applied to the transfer gate 52. Also, the time interval of the transfer pulse is constant during one frame period. Therefore, the sensitivity of the photodiode 51 is constant.

In the sensor illustrated in FIG. 9, each photosensitive cell is formed by four transistors (the transfer gate 52, the amplifier transistor 54, the reset transistor 55, and the address transistor 56). By contrast, in some sensors recently devised for achieving size reduction, each photosensitive cell is formed by three transistors. Such a newly devised sensor has a structure in which the address transistor 56 is omitted from the sensor illustrated in FIG. 9 and a power source is shared among the photosensitive cells. In order to allow signals to be read from this sensor, a pulse-type source voltage is required to be supplied to each photosensitive cell.

The scheme of driving the sensor as illustrated in FIG. 9 is disclosed in, for example, Japanese Patent Laid-Open Publication No. 9-247537 (1997-247537). As for a sensor in which photosensitive cells are each formed by three transistors, no documents describing a specific layout of these photosensitive cells are known.

In the above sensor as well as a semiconductor integrated circuit, the circuit layout is a key to determine the size of the circuit, as well as the circuit configuration and design rules. In general, as the circuit size is smaller, yields of the circuit are improved more, thereby reducing the cost of the circuit. Therefore, laying out a circuit according to predetermined design rules is an important technical task in designing the semiconductor integrated circuit. However, as for a sensor in which photosensitive cells are each formed by three transistors, no specific layout of these photosensitive cells has been clearly known to public.

SUMMARY OF THE INVENTION

Therefore, an object of the present invention is to clarify a new circuit configuration of a sensor in which photosensitive cells are each formed by three transistors, and to provide a sensor of small circuit size.

The present invention has the following features to attain the object mentioned above.

A solid-state imaging device of the present invention outputs an electrical signal in accordance with an intensity of a received optical signal. The solid-state imaging device includes a photosensitive region having photosensitive cells two-dimensionally arranged in row and column directions on a semiconductor substrate, a power supply line, a vertical driver circuit, a plurality of vertical signal lines, a plurality of load registers, a noise suppression circuit, a plurality of horizontal transistors, and a horizontal driver circuit. Each of the photosensitive cells includes a photodiode for storing a signal electric charge obtained by performing optical-electrical conversion on received light, a transfer transistor for transferring the signal electric charge stored in the photodiode, a floating diffusion layer section for temporarily storing the transferred signal electric charge, an amplifier transistor for amplifying the signal electric charge stored in the floating diffusion layer section, and a reset transistor for resetting the signal electric charge stored in the floating diffusion layer section. The power supply line is commonly connected to drains of the amplifier transistors. The vertical driver circuit drives the transfer transistors arranged in a same row and the reset transistors arranged in another same row. The vertical signal lines are commonly connected to the amplifier transistors arranged in a same column. The load transistors are respectively connected to the vertical signal lines. The noise suppression circuit suppresses noise of signals output to the vertical signal lines. The horizontal transistors are arranged in the row direction and are supplied with outputs from the noise suppression circuit. The horizontal driver circuit sequentially and selectively causes the horizontal transistors to be operated so as to cause the outputs to be sequentially produced from the noise suppression circuit. In each photosensitive cell, the photodiode, the transfer transistor, the floating diffusion layer section, the amplifier transistor, and the reset transistor are formed in one active region surrounded by a device insulation region, and the floating diffusion layer section included in a given one of the photosensitive cells is connected to a gate of an amplifier transistor included in a photosensitive cell adjacent to the given photosensitive cell in the column direction.

With this, it is possible to attain a circuit configuration of the photosensitive cells for achieving a suitable layout without impairing the function of the solid-state imaging device. This makes it possible to reduce the size of the laid-out photosensitive cells and, in turn, reduce the circuit size of the entire sensor.

In this solid-state imaging device, a plurality of first horizontal signal lines commonly connected to gate electrodes of the transfer transistors arranged in the same row and a plurality of second horizontal signal lines commonly connected to gate electrodes of the reset transistors arranged in the same row can be made of a same material. Also, the floating diffusion layer section in a given one of the photosensitive cells can be located between the first horizontal signal line connected to the gate electrode of the transfer transistor included in the same photosensitive cell and the second horizontal signal line connected to a gate electrode of the reset transistor included in the given photosensitive cell.

With the first horizontal signal line and the gate electrode of the transfer transistor, and the second horizontal signal line and the gate electrode of the reset transistor being made of the same material, no contact holes are required for routing these signal lines. Therefore, it is possible to reduce the size of the laid-out photosensitive cells, thereby reducing the entire size of the entire sensor.

Also, a first contact hole can be provided on the floating diffusion layer section so as to connect the floating diffusion layer section and a gate of the amplifier transistor, a second contact hole can be provided on a common drain shared by the amplifier transistor and the reset transistor so as to connect the common drain to the power supply line, a third contact hole can be provided on a source of the amplifier transistor so as to connect the source to a corresponding one of the vertical signal lines, and a fourth contact hole can be provided on a wiring area where the gate of the amplifier transistor is located so as to connect the floating diffusion layer section and the gate of the amplifier transistor. Further, the first contact hole, the second contact hole, the third contact hole, and the fourth contact hole may be aligned approximately in a straight line. Still further, the first through third contact holes may be aligned approximately in a straight line.

With the plurality of contact holes being aligned approximately in a straight line in the layout of the photosensitive cells, it is possible to reduce an area required for layout of these contact holes. Therefore, it is possible to reduce the size of the laid-out photosensitive cells, thereby reducing the entire size of the entire sensor.

Still further, a signal line connecting the floating diffusion layer section and the gate of the amplifier transistor, the power supply line, and the vertical signal lines are formed in a same metal wire layer.

With the signal line which connects the floating diffusion layer section and the gate of the amplifier transistor, the power supply line, and the vertical signal lines being formed by the same metal wire layer, no contact holes are required for routing these signal lines. Therefore, it is possible to reduce the size of the laid-out photosensitive cells, thereby reducing the entire size of the entire sensor.

Still further, the power supply line may include a plurality of vertical power supply lines commonly connected to drains of the amplifier transistors arranged on the same column. Also, a signal line connecting a given one of the floating diffusion layer sections and a gate of a corresponding one of the amplifier transistors together may be located between one of the vertical signal lines which is connected to the amplifier transistor of one of the photosensitive cells which includes the given floating diffusion layer section and one of the vertical power supply lines which is connected to a drain of the corresponding amplifier transistor.

With this, the layout pattern of the photosensitive cells can be made simple and regular. Therefore, it is possible to reduce the size of the laid-out photosensitive cells, thereby reducing the entire size of the entire sensor.

Still further, all of the transistors included in each of the photosensitive cells are N-channel MOS transistors.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a timing chart showing a scheme of driving the sensor according to the embodiment of the present invention;

FIG. 10 is a timing chart showing a scheme of driving the conventional sensor.

DESCRIPTION OF THE PREFERRED EMBODIMENT

Figure 1:
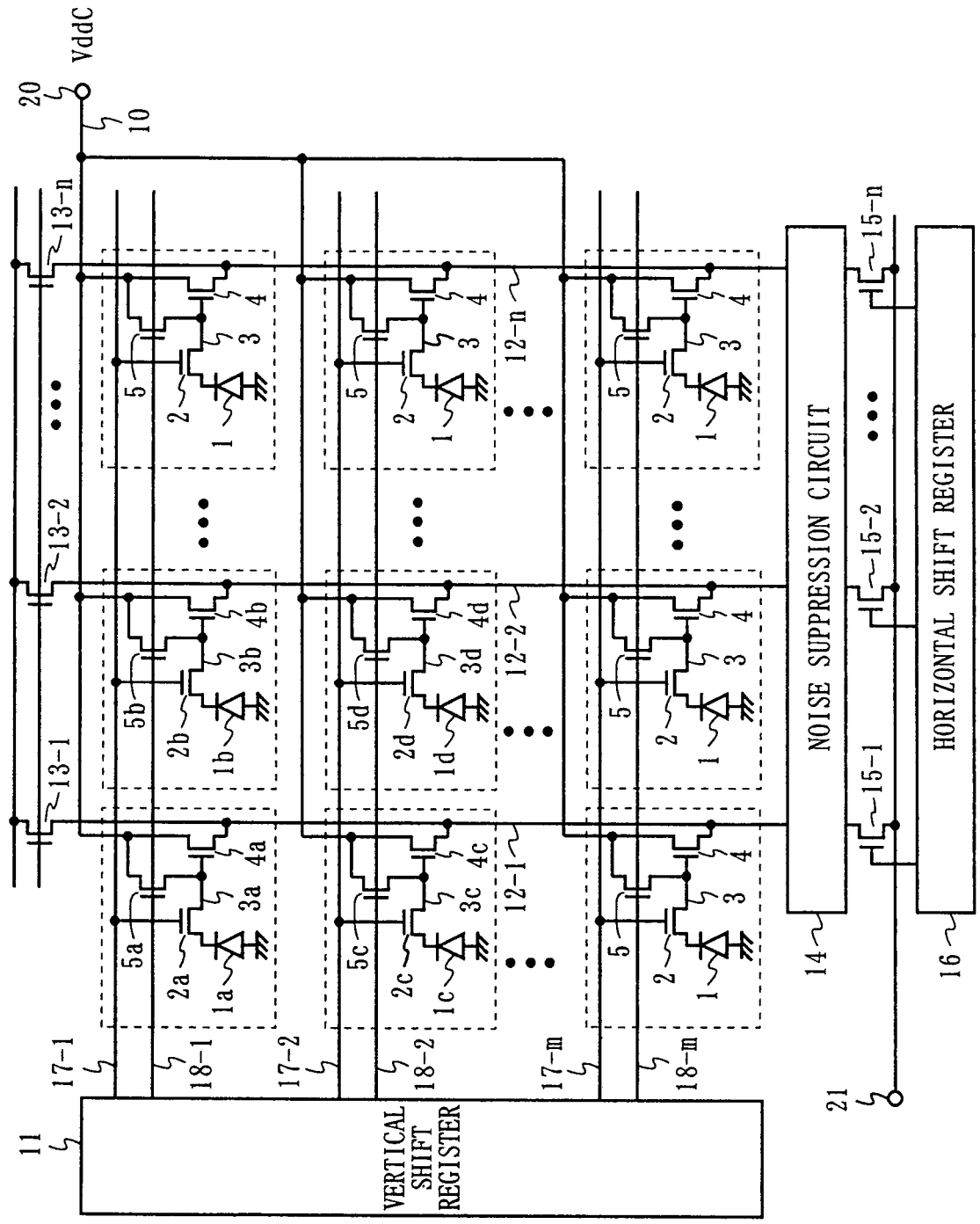
FIG. 1 is a circuit diagram of an exemplary sensor which is referred to for describing the present invention.

Prior to descriptions of a sensor according to an embodiment of the present invention, an exemplary sensor in which photosensitive cells are each formed by three transistors is described. The exemplary sensor illustrated in FIG. 1 includes photosensitive cells (each surrounded by a dotted line) arranged in an m×n matrix, a power supply line 10, a vertical shift register 11, n vertical signal lines 12-*l* through 12-*n*, n load registers 13-*l* through 13-*n*, a noise suppression circuit 14, n horizontal transistors 15-*l* through 15-*n*, and a horizontal shift register 16. Each photosensitive cell includes a photodiode 1, a transfer gate 2, a floating diffusion layer section 3, an amplifier transistor 4, and a reset transistor 5. Of four photosensitive cells on the first and second rows and columns in FIG. 1, the components included in the same photosensitive cell are provided with the same suffix (a through d) for identification. The photosensitive cell has a feature of including three transistors (the transfer gate 2, the amplifier transistor 4, and the reset transistor 5) and not including an address transistor. In practice, values of m and n in the sensor are of the order of several tens to thousands.

The photosensitive cells arranged in an m×n matrix are formed on a semiconductor substrate. In more detail, the photosensitive cells are formed on a P-type substrate or in a P-well on an N-type substrate. In each photosensitive cell, the photodiode 1 performs optical-electrical conversion on received light, and then stores a signal electric charge. The transfer gate 2 is provided between the photodiode 1 and the floating diffusion layer section 3 to transfer the signal electric charge stored in the photodiode 1 to the floating diffusion layer section 3. The floating diffusion layer section 3 temporarily stores the signal electric charge transferred from the photodiode 1. The amplifier transistor 4 amplifies the signal electric charge stored in the floating diffusion layer section 3. The reset transistor 5 resets the signal electric charge stored in the floating diffusion layer section 3.

On a photosensitive region where these photosensitive cells are arranged, the power supply line 10 and vertical signal lines 12-*l* through 12-*n* are routed. Furthermore, signal lines of two types, that is, m signal lines 17-*l* through 17-*m* and m signal lines 18-*l* through 18-*m*, are routed. The power supply line 10 is commonly connected to the drains of the amplifier transistors 4 of all photosensitive cells. In this example, it is assumed that the power supply line 10 is commonly connected at one end to the drains of the amplifier transistors 4 and the drains of the reset transistors 5 included in all photosensitive cells. Also, it is assumed that every photosensitive cell is applied with a pulse-type source voltage VddC supplied through a power supply terminal 20 located at the other end of the power supply line 10. Note that, although every photosensitive cell is connected to the single power supply line 10 in FIG. 1, two or more power supply lines can be used for supplying power to every photosensitive cell.

The vertical signal lines 12-*l* through 12-*n* are respectively provided for the columns of the photosensitive cells. The vertical signal lines 12-*l* through 12-*n* each connect a corresponding one of the amplifier transistors 4 included in the photosensitive cells arranged in the same column, a corresponding one of the load transistors 13-*l* through 13-*n*, and the noise suppression circuit 14 together. The signal lines 17-*l* through 17-*m* and the signal lines 18-*l* through 18-*m* are output signal lines of the vertical shift register 11, and are respectively provided for the rows of the photosensitive cells. The signal lines 17-*l* through 17-*m* each connect the gates of the transfer gates 2 included in the photosensitive cells arranged in the same row. The signal lines 18-*l* through 18-*m* each connect the gates of the reset transistors 5 included in the photosensitive cells arranged in the same row.

The vertical shift register 11 operates as a vertical driver circuit in a manner as follows. When the source voltage VddC is at a high level, the vertical shift register 11 simultaneously drives the transfer gates 2 included in the photosensitive cells arranged in the same row. Also when the source voltage VddC is at a high level, the vertical shift register 11 simultaneously drives the reset transistors 5 included in the photosensitive cells arranged in the same row. However, this operation of driving the reset transistors 5 is performed at a time different from the time of the above-stated operation of driving the transfer gates 2. The load transistors 13-*l* through 13-*n* are connected to the vertical signal lines 12-*l* through 12-*n*, respectively, and are aligned in the row direction. The noise suppression circuit 14 is connected to the vertical signal lines 12-*l* through 12-*n*, and is fed with signals output from the amplifier transistors 4 to eliminate noise components included in the fed signals. The horizontal transistors 15-*l* through 15-*n* are arranged in the row direction. The horizontal transistors 15-*l* through 15-*n* are each supplied with the corresponding one of n signals output from the noise suppression circuit 14. The horizontal shift register 16 operates as a horizontal driver circuit. That is, the horizontal shift register 16 sequentially and selectively causes the horizontal transistors 15-*l* through 15-*n* to operate. With this, n signals output from the noise suppression circuit 14 are sequentially output from an output terminal 21.

Figure 2A:
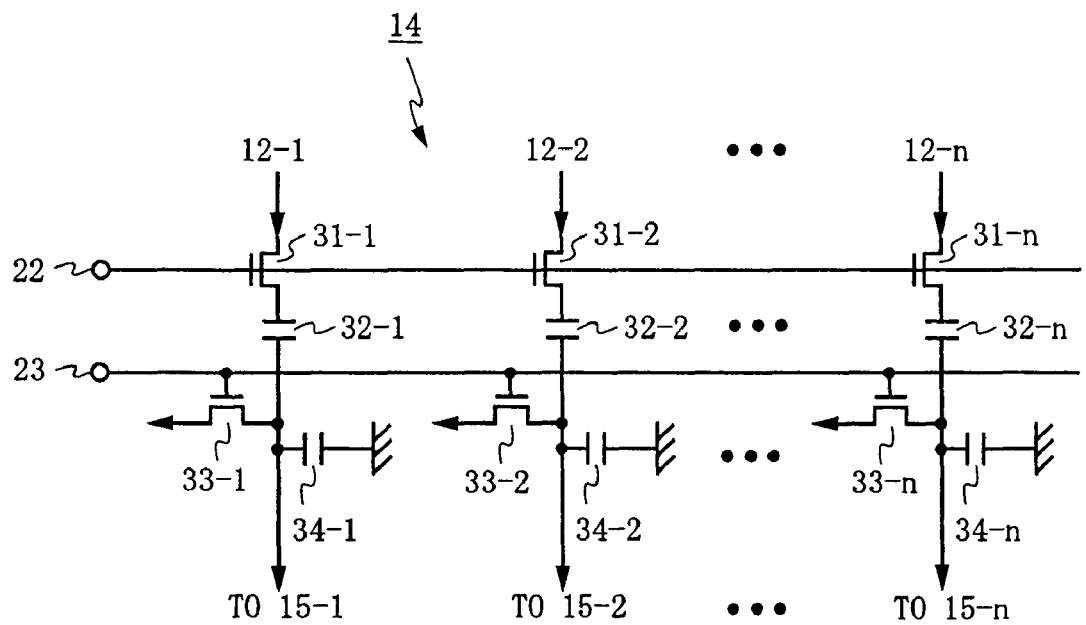
FIGS. 2A and 2B are detailed illustrations of a noise suppression circuit of a sensor according to an embodiment of the present invention.
Figure 2B:
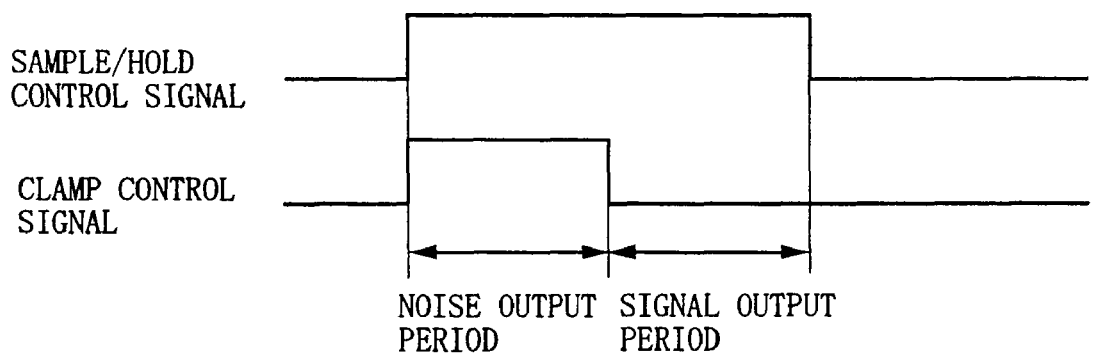
Figure 9:
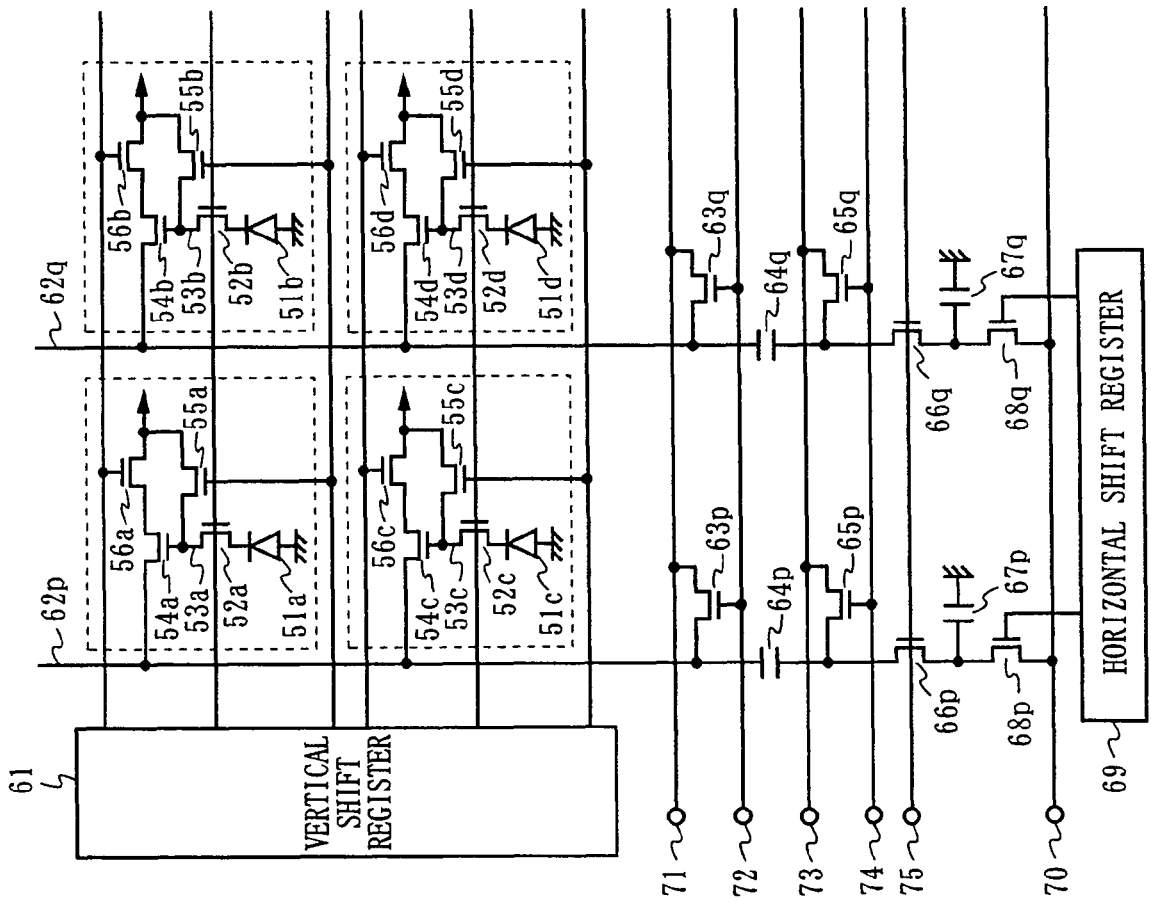
FIG. 9 is a circuit diagram of a conventional sensor.

FIGS. 2A and 2B are illustrations for describing in detail the noise suppression circuit 14. As illustrated in FIG. 2A, the noise suppression circuit 14 includes n sample/hold transistors 31-*l* through 31-*n*, n clamp capacitors 32-*l* through 32-*n*, n clamp transistors 33-*l* through 33-*n*, and n sample/hold capacitors 34-*l* through 34-*n*. The noise suppression circuit 14 operates in a manner similar to that of the noise suppression circuit illustrated in FIG. 9, although the sample/hold transistors 31-*l* through 31-*n* are positioned differently from their counterparts in FIG. 9. The gate of each of the sample/hold transistors 31-*l* through 31-*n* is applied with a sample/hold control signal input from a control terminal 22. Similarly, the gate of each of the clamp transistors 33-*l* through 33-*n* is applied with a clamp control signal input from a control terminal 23. These two control signals are changed as illustrated in FIG. 2B. A period during which these two control signals are both at a high level is a noise output period. A period during which the sample/hold control signal is at a high level and the clamp control signal is at a low level is a signal output period.

With reference to a timing chart illustrated in FIG. 3 as required, a scheme of driving the sensor illustrated in FIG. 1 is described below. In order to drive this sensor, the scheme to be performed includes: a step of pulse driving the power supply line 10 for each horizontal period; a step of reading, by the vertical shift register 11, signals from one row of the m×n photodiodes 1; and a step of sequentially outputting, by the horizontal shift register 16, the signals read from the one row.

As illustrated in FIG. 3, in the initial state, the source voltage VddC is at a low level. That is, in the initial state, the power supply line 10 has not yet been driven. In order to extract signals from the photosensitive cells on the first row, the source voltage VddC is first controlled to be at a high level. This causes the drains of the transfer gate 2 and the reset transistor 5 of every photosensitive cell to be at a high level. Next, while the power supply line 10 is being driven, the vertical shift register 11 causes the signal line 18-*l* to be at a high level for a predetermined time period. This causes the gate potentials of the reset transistors 5, including the reset transistors 5*a* and 5*b*, of the photosensitive cells on the first row to be at a high level, thereby causing these reset transistors 5 to be in an ON state. At this time, the amplifier transistors 4, including the amplifier transistors 4*a* and 4*b*, of the photosensitive cells on the first row are also in an operating state. At the same time, noise outputs appear on the vertical signal lines 12-*l* through 12-*n*. These noise outputs occur when the signal electric charges stored in the floating diffusion layer sections 3, including the floating diffusion layer sections 3*a* and 3*b*, of the photosensitive cells on the first row are reset.

Next, while the power supply line 10 is being driven, the vertical shift register 11 causes the signal line 17-*l* to be at a high level for a predetermined time period. This causes the gate potentials of the transfer gates 2, including the transfer gates 2*a* and 2*b*, of the photosensitive cells on the first row to be at a high level, thereby causing these transfer gates 2 to be in an ON state. At this time, the signal electric charges stored in the photodiodes 1, including the photodiodes 1*a* and 1*b*, of the photosensitive cells on the first row are read to the floating diffusion layer sections 3. Signal outputs which correspond to the read signal electric charges then appear on the vertical signal lines 12-*l* through 12-*n*.

In this way, on each of the vertical signal lines 12-*l* through 12-*n*, a noise voltage and then a sum of the signal voltage and the noise voltage appear. The noise suppression circuit 14 then operates similarly to a conventional noise suppression circuit, suppressing noise of the signals output to the vertical signal lines 12-*l* through 12-*n*. The noise suppression circuit 14 then outputs n signals to the respective horizontal transistors 15-*l* through 15-*n*.

After the operation of the noise suppression circuit 14, the source voltage VddC is changed to be at a low level. Next, while the power supply line 10 is not being driven, the vertical shift register 11 causes the signal line 18-*l* to be at a high level for a predetermined time period. This causes the signal electric charges stored in the floating diffusion layer sections 3, including the floating diffusion layer sections 3*a* and 3*b*, of the photosensitive cells on the first row to be reset. Also, the amplifier transistors 4, including the amplifier transistors 4*a* and 4*b*, of the photosensitive cells on the first row are set to be a non-operating state until they are selected next time.

The horizontal shift register 16 then produces n output signals which are coupled to the gates of the horizontal transistors 15-*l* through 15-*n*. The horizontal shift register 16 selectively causes these n output signals to be at a high level, thereby sequentially and selectively controlling the horizontal transistors 15-*l* through 15-*n* to be in an ON state. With this, signals corresponding to the signal electric charges stored in the photodiodes 1, including the photodiodes 1*a* and 1*b*, on the first row are sequentially output from the output terminal 21.

Next, in order to extract signals from the photosensitive cells on the second row, an operation similar to that performed on those on the first row is performed on those on the second row. With this, signals corresponding to the signal electric charges stored in the photodiodes 1, including the photodiodes 1*c* and 1*d*, on the second row are sequentially output from the output terminal 21. Then, the same goes for the photosensitive cells on the third through m-th rows. Note that the definitions of a horizontal blanking period, a horizontal effective period, one horizontal period, and one frame period illustrated in FIG. 3 are the same as those in the conventional sensor. Also, as with the conventional sensor, the sensitivity of each photodiode 1 of the exemplary sensor is constant.

Figure 4:
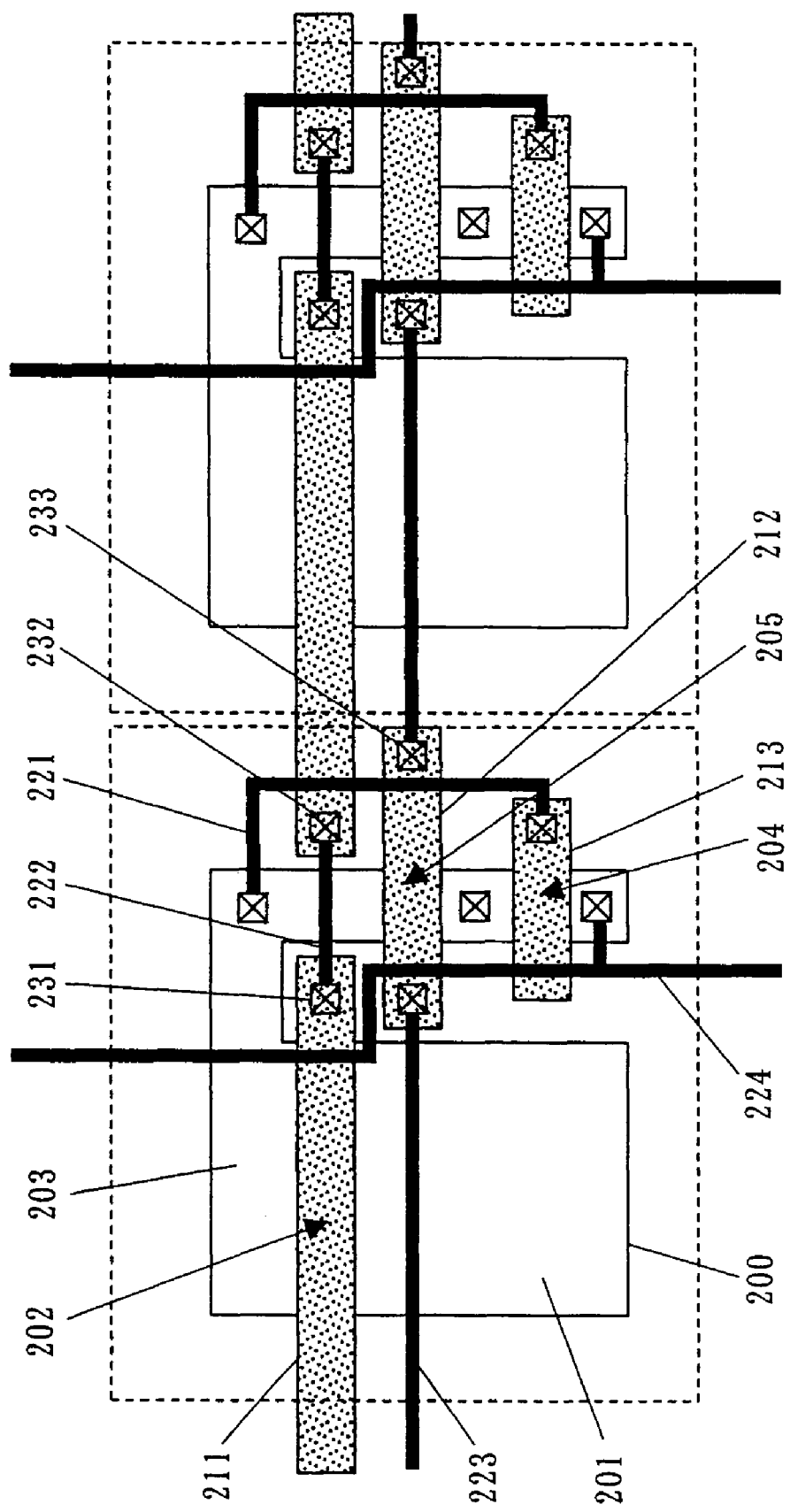
FIG. 4 is a diagram illustrating a layout of the exemplary sensor which is referred to for describing the present invention.

The layout pattern of the photosensitive cells included in the exemplary sensor of FIG. 1 can be as illustrated in FIG. 4, for example, if no particular consideration is given to the layout. In FIG. 4, a portion surrounded by a dotted line corresponds to one photosensitive cell. Also, in each photosensitive cell, an area surrounded by a thin solid line represents an active region 200, hatched areas represent polysilicon wires 211 through 213, black thick lines represent metal wires 221 through 224, and squares with diagonal lines represent contact holes. Note that the above notation is also applied to other layout diagrams described further below.

The active region 200 is surrounded by a device isolation region (not shown), and has formed therein devices serving as circuits and their electrodes, such as photodiodes, and the gate, source, and drain of each transistor. In the layout pattern illustrated in FIG. 4, each photosensitive cell includes one active region 200.

In portions where the active region 200 and the polysilicon wires 211 through 213 overlap with each other, transistors are formed. In FIG. 4, in each photosensitive cell, the active region 200 and the polysilicon wires 211 through 213 overlap with each other at three portions. Specifically, in a portion where the active region 200 and the polysilicon wire 211 overlap with each other, a transfer gate 202 (the transfer gate 2 in FIG. 1) is formed. In a portion where the active region 200 and the polysilicon wire 212 overlap with each other, a reset transistor 205 (the reset transistor 5 in FIG. 1) is formed. In a portion where the active region 200 and the polysilicon wire 213 overlap with each other, an amplifier transistor 204 (the amplifier transistor 4 in FIG. 1) is formed.

Of the active region 200, an area defined by the transfer gate 202 and the reset transistor 205 corresponds to a floating diffusion layer section 203 (the floating diffusion layer section 3 in FIG. 1). Also, of the active region 200, an area located on the opposite side of the transfer gate 202 from the floating diffusion layer section 203 corresponds to a photodiode 201 (the photodiode 1 in FIG. 1).

With the three transistors and the floating diffusion layer section 203 formed in the above-described manner being electrically connected to each other with a predetermined scheme, the photosensitive cells illustrated in FIG. 1 can be achieved. In the layout pattern illustrated in FIG. 4, connection is achieved by metal wires. Specifically, metal wires of five types are used for each photosensitive cell, and those of four types, that is, the metal wires 221 through 224, are shown in FIG. 4. The metal wire 221 connects the floating diffusion layer section 203 and the gate of the amplifier transistor 204 both included in the same photosensitive cell. The metal wire 222 connects the polysilicon wires 211 included in the photosensitive cells adjacent to each other in the row direction. These polysilicon wires 211 and the metal wire 222 form the signal line 17 illustrated in FIG. 1. The metal wire 223 connects the polysilicon wires 212 included in the photosensitive cells adjacent to each other in the row direction. These polysilicon wires 212 and the metal wire 223 form the signal line 18 illustrated in FIG. 1. The metal wire 224 connects the sources of the amplifier transistors 204 included in the photosensitive cells arranged on the same column. The metal wire 224 forms the vertical signal line 12 illustrated in FIG. 1. Note that the power supply line 10 illustrated in FIG. 1 is not shown in FIG. 4.

In semiconductor manufacturing, the active region 200, the polysilicon wires 211 through 213, and the metal wires 221 through 224 are formed in different processes. In order to electrically connect the region and wires of these three types, contact holes are required for connecting layers. In the layout pattern illustrated in FIG. 4, each photosensitive cell is provided with eight contact holes.

As described above, in the layout pattern illustrated in FIG. 4, the polysilicon wires 211 and the metal wire 222 forms the signal line 17 illustrated in FIG. 1. This is because extending the polysilicon wire 211 to a portion of the metal wire 222 causes another overlapping of the active region 200 and the polysilicon wire, thereby forming an unwanted transistor in this overlapping portion. However, when the polysilicon wires 211 and the metal wire 222 are used, two contact holes 231 and 232 are required in each photosensitive cell for connecting these wires together. Accordingly, the metal wire 221 has to be routed so as to go around the contact hole 232. Furthermore, a contact hole 233 has to be provided on the metal wire 223 side (on the right side in FIG. 4) of the metal wire 221, thereby disadvantageously increasing the size of the photosensitive cells in the horizontal direction. As such, in the layout pattern illustrated in FIG. 4, with the signal line 17 being formed by two types of wires, the size of the photosensitive cells in the horizontal direction is disadvantageously increased.

Figure 5:
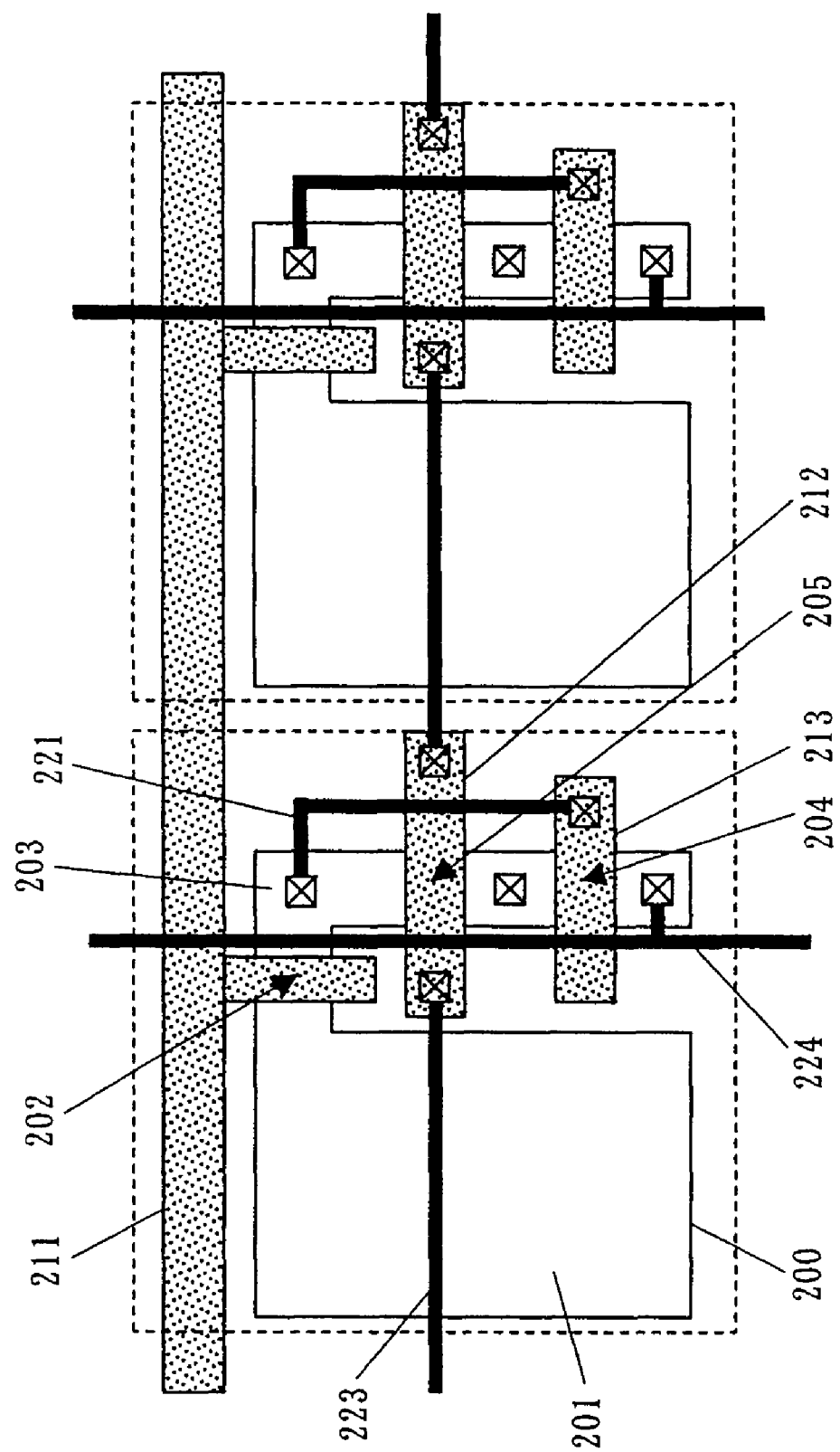
FIG. 5 is a diagram illustrating another layout of the exemplary sensor which is referred to for describing the present invention.

With particular consideration being given in order to get around the above disadvantage, the layout pattern of the photosensitive cells included in the exemplary sensor of FIG. 1 can be as illustrated in FIG. 5, for example. In this layout pattern, the signal line 17 is achieved only by the polysilicon wire 211. Therefore, the layout pattern of FIG. 5 does not require the contact holes 231 and 232 included in the layout pattern of FIG. 4, thereby reducing the size of the photosensitive cells in the horizontal direction, compared with the layout pattern of FIG. 4.

In the layout pattern illustrated in FIG. 5, however, the polysilicon wires 212 and the metal wire 223 form the signal line 18 illustrated in FIG. 1. By forming the signal line 18 only with the polysilicon wire 212, the size of the photosensitive cells can be further reduced.

The following descriptions of a sensor according to one embodiment of the present invention focuses on a new circuit configuration of photosensitive cells for achieving a suitable layout, and the layout results of the photosensitive cells having this circuit configuration.

Figure 6:
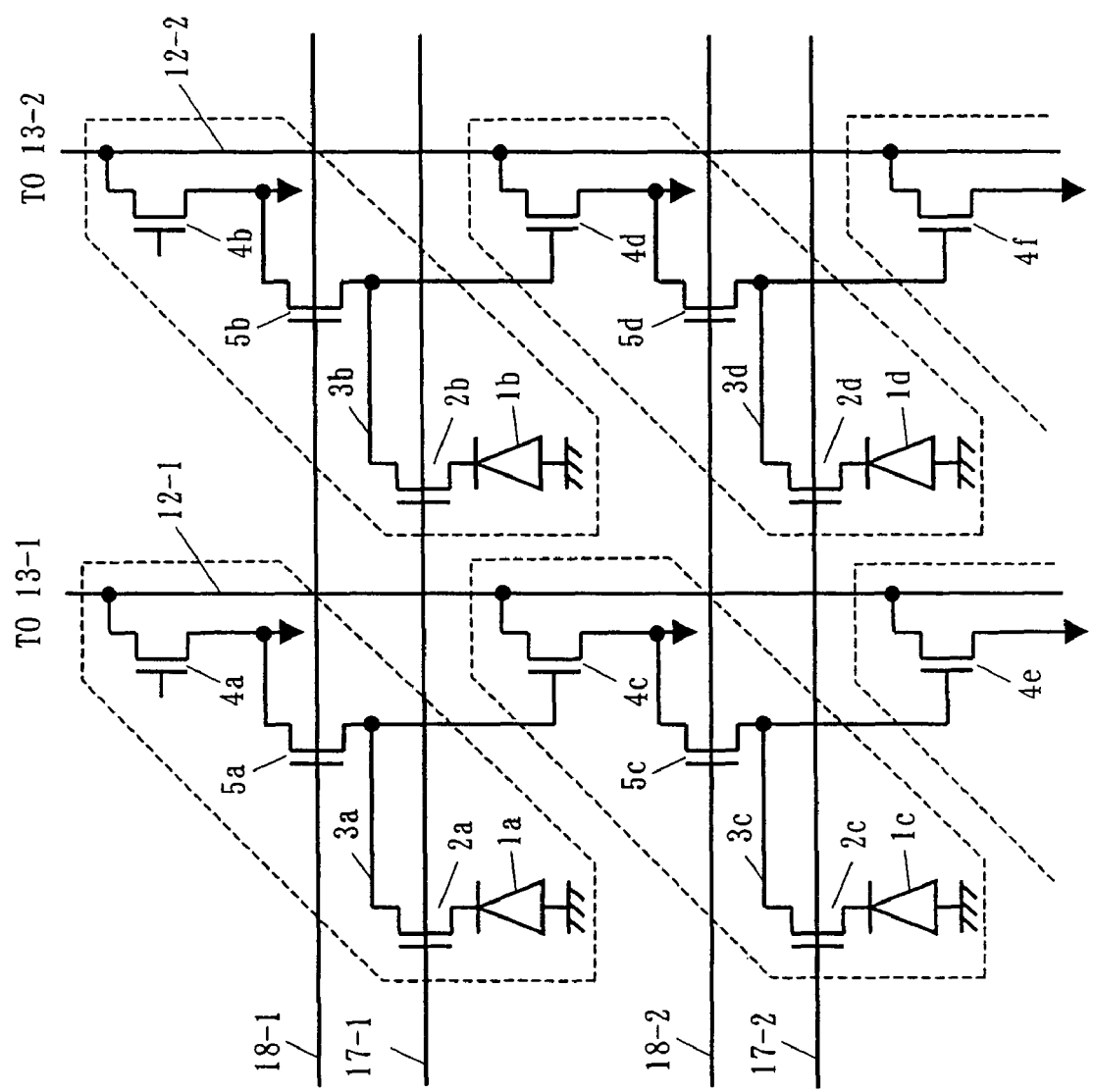
FIG. 6 is a circuit diagram of the sensor according to the embodiment of the present invention.

FIG. 6 is a circuit diagram of the sensor according to the embodiment of the present invention. The sensor according to the embodiment is different from the exemplary sensor (FIG. 1) only in circuit configuration of the photosensitive cells. Therefore, FIG. 6 mainly illustrates photosensitive cells (each surrounded by a dotted line) arranged in a 2×2 matrix, and does not illustrate the same circuits as those in FIG. 1 (the vertical shift register 11, the load transistor 13-*l* through 13-*n*, the noise suppression circuit 14, the horizontal transistors 15-*l* through 15-*n*, and the horizontal shift register 16).

In the sensor according to the embodiment, as with the exemplary sensor, each photosensitive cell includes a photodiode 1, a transfer gate 2, a floating diffusion layer section 3, an amplifier transistor 4, and a reset transistor 5. These five components function in a manner similar to that of the exemplary sensor.

The photosensitive cell included in the sensor according to the embodiment is different from that included in the exemplary sensor in the following point. That is, in the exemplary sensor, as described above, the floating diffusion layer section 3 included in one photosensitive cell is connected to the gate of the amplifier transistor 4 included in the same photosensitive cell. By contrast, in the sensor according to the embodiment, as illustrated in FIG. 6, the floating diffusion layer section 3 included in a given photosensitive cell is connected to the gate of the amplifier transistor 4 included in another photosensitive cell adjacent to the given photosensitive cell in the row direction (in FIG. 6, a photosensitive cell directly below the given photosensitive cell). For example, in FIG. 6, the floating diffusion layer section 3*a* included in the photosensitive cell shown on the upper left is connected to the gate of the amplifier transistor 4*c* included in the photosensitive cell located on the lower left. Similarly, the floating diffusion layer section 3*c* included in the photosensitive cell shown on the lower left is connected to the gate of the amplifier transistor 4*e* included in the photosensitive cell (only a portion thereof is shown in FIG. 6) located directly below the lower-left photosensitive cell.

As such, with the floating diffusion layer section 3 being connected to the gate of the amplifier transistor 4 included in another photosensitive cell, a signal output corresponding to the signal electric charge stored in the photodiode 1 appears on the vertical signal line 12 by means of the operation of the amplifier transistor 4 included in the other photosensitive cell. Even with this circuit configuration, the entire operation of the sensor is the same as that of the exemplary sensor, as long as these two photosensitive cells are arranged on the same column. Therefore, by applying the scheme of driving the exemplary sensor (refer to FIG. 3) to the sensor according to the embodiment, an electrical signal corresponding to an optical signal supplied to the sensor can be correctly read even from the sensor according to the embodiment.

Figure 7:
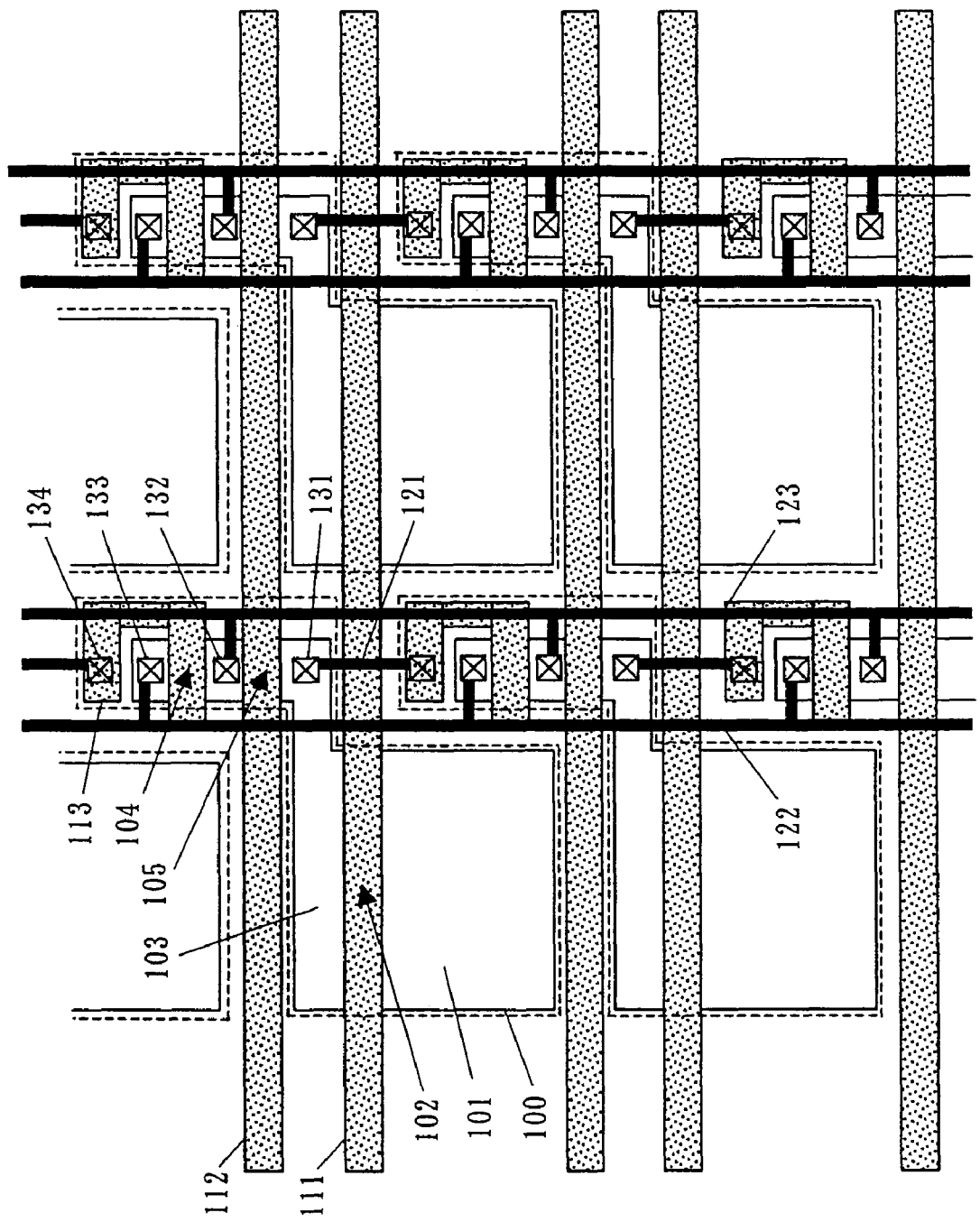
FIG. 7 is a diagram illustrating a layout of the sensor according to the embodiment of the present invention.

The layout pattern of the photosensitive cells of FIG. 6 can be as illustrated in FIG. 7. In this layout pattern, as with the layout patterns in FIGS. 4 and 5, one active region 100 is included in each photosensitive cell. In each photosensitive cell, the active region 100 and polysilicon wires 111 through 113 overlap with each other at three portions, where three transistors are formed in each photosensitive cell. Specifically, in the portion where the active region 100 and the polysilicon wire 111 overlap with each other, a transfer gate 102 (the transfer gate 2 in FIG. 6) is formed. In the portion where the active region 100 and the polysilicon wire 112 overlap with each other, a reset transistor 105 (the reset transistor 5 in FIG. 6) is formed. In the portion where the active region 100 and the polysilicon wire 113 overlap with each other, an amplifier transistor 104 (the amplifier transistor 4 in FIG. 6) is formed.

Of the active region 100, an area defined by the transfer gate 102 and the reset transistor 105 corresponds to a floating diffusion layer section 103 (the floating diffusion layer section 3 in FIG. 6). Also, of the active region 100, an area located on the opposite side of the transfer gate 102 from the floating diffusion layer section 103 corresponds to a photodiode 101 (the photodiode 1 in FIG. 6).

In the layout pattern illustrated in FIG. 7, metal wires 121 through 123 of three types are used in each photosensitive cell. The metal wire 121 connects the floating diffusion layer section 103 included in a given photosensitive cells and the gate of the amplifier transistor 104 included in another photosensitive cell adjacent to the given photosensitive cell in the column direction. The metal wire 122 connects the sources of the amplifier transistors 104 included in the photosensitive cells arranged on the same column, thereby forming the vertical signal line 12 illustrated in FIG. 1. The metal wire 123 connects common drains shared by the amplifier transistors 104 and the reset transistors 105 included in the photosensitive cells arranged on the same column, thereby achieving a part of the power supply line 10 (a portion extending in the column direction) illustrated in FIG. 1. Note that the layout pattern of FIG. 7 does not require metal wires corresponding to the metal wires 222 and 223 included in the layout pattern of FIG. 4.

In semiconductor manufacturing, the active region 100, the polysilicon wires 111 through 113, and the metal wires 121 through 123 are formed in different processes. In order to electrically connect the region and wires of these three types, four contact holes 131 through 134 are provided for each photosensitive cell in the layout pattern illustrated in FIG. 7.

Compared with the layout patterns of the photosensitive cells included in the exemplary sensor (FIGS. 4 and 5), the layout pattern of the photosensitive cells included in the sensor according to the embodiment (FIG. 7) has the following features. In the layout pattern of the exemplary sensor, the photosensitive region is laid out on a rectangular area. By contrast, in the layout pattern of the sensor according to the embodiment, the photosensitive region is laid out on an area joining two rectangles together (a portion surrounded by a dotted line) in accordance with the shape of the active region 100. In more detail, it is assumed herein that three photosensitive cells A, B, and C are provided, and the photosensitive cell B is adjacent to the photosensitive cell A in the row direction, and the photosensitive cell C is adjacent to the photosensitive cell A in the column direction. Here, consider a case where each photosensitive cell is divided into a first region and a second region, the first region including the photodiode 101, the transfer gate 102, and a part of the floating diffusion layer section 103 (in FIG. 7, a region on the left side of the metal wire 122) and the second region including the remaining floating diffusion layer section 103, the amplifier transistor 104, and the reset transistor 105 (in FIG. 7, a region on the right side of the metal wire 122). In this case, broadly speaking, the second region of the photosensitive cell C is laid out between the first region of the photosensitive cell A and the first region of the photosensitive cell B. This makes it easy to connect the floating diffusion layer section 103 included in a given photosensitive cell and the gate of the amplifier transistor 104 included in another photosensitive cell adjacent to the given photosensitive cell in the column direction.

Also, in the layout pattern of the exemplary sensor, at least either one of the signal lines 17 and 18 illustrated in FIG. 1 is formed by both of the polysilicon wire and the metal wire. By contrast, in the layout pattern of the sensor according to the embodiment, the signal line 17 is formed only by the polysilicon wire 111, and the signal line 18 is formed only by the polysilicon wire 112. In other words, the signal lines 17 and 18 are made of the same material. Furthermore, the floating diffusion layer section 103 is located between the polysilicon wire 111 connected to the transfer gate 102 included in the same photosensitive cell and the polysilicon wire 112 connected to the reset transistor 105 included in the same photosensitive cell. As such, the signal line 17 and the gate electrode of the transfer gate 102, and the signal line 18 and the gate electrode of the reset transistor are respectively made of the same material. Therefore, in order to route these signal lines, no contact holes are required. This reduces the size of the laid-out photosensitive cells, thereby reducing the circuit size of the entire sensor.

Furthermore, in the layout pattern of the sensor according to the embodiment, as described above, the metal wires 121 through 123 of three types are used, and the four contact holes 131 through 134 are provided. The contact hole 131 is provided on the floating diffusion layer section 103 so as to connect the floating diffusion layer section 103 and the gate of the amplifier transistor 104 together. The contact hole 132 is provided on a common drain shared by the amplifier transistor 104 and the reset transistor 105 so as to connect the common drain to the metal wire 123 (the power supply line 10 in FIG. 1). The contact hole 133 is provided on the source of the amplifier transistor 104 so as to connect the source to the metal wire 122 (the vertical signal line 12 in FIG. 1). The contact hole 134 is provided on the same wiring region as that of the gate of the amplifier transistor 104 so as to connect the floating diffusion layer section 103 and the gate of the amplifier transistor 104 together. In the layout pattern of the sensor according to the embodiment, these four contact holes 131 through 134 are aligned approximately in one straight line. This can reduce an area required for layout of these four contact holes. Therefore, it is possible to reduce the size of the laid-out photosensitive cells, thereby reducing the circuit size of the entire sensor.

Still further, the metal wire 121, which connects the floating diffusion layer section 103 and the gate of the amplifier transistor 104 together, the metal wire 122 (the vertical signal line 12 in FIG. 1), and the metal wire 123 (the power supply line 10 in FIG. 1) are all made of metal. Thus, these wires of three types can be formed by using the same metal wire layer. Therefore, no contact holes are required for routing these signal lines. Therefore, it is possible to reduce the size of the laid-out photosensitive cells, thereby reducing the circuit size of the entire sensor.

Still further, the metal wires 122 and 123 are routed in parallel on the photosensitive regions having arranged thereon the photosensitive cells, with the metal wire 121 being located between the metal wires 122 and 123. In more detail, the metal wire 121 connecting the floating diffusion layer section 103 and the gate of the amplifier transistor 104 is located between the metal wire 122 connected to the amplifier transistor 104 included in the photosensitive cell that includes the above floating diffusion layer section 103, and the metal wire 123 connected to the drain of the above amplifier transistor 104. This makes the layout pattern of the photosensitive cells simple and regular. Therefore, it is possible to reduce the size of the laid-out photosensitive cells, thereby reducing the circuit size of the entire sensor.

In this way, the photosensitive cells included in the sensor illustrated in FIG. 6 can be laid out regularly with the least amount of space wasted. Furthermore, unlike the layout patterns illustrated in FIGS. 4 and 5, the layout pattern illustrated in FIG. 7 does not have any metal wires routed on the photodiode. Therefore, according to the embodiment, by adopting a circuit configuration of the sensor for achieving a suitable layout of the photosensitive cell each formed by three transistors, it is possible to reduce the size of the photosensitive cells and, in turn, reduce the size of the entire sensor. This offers effects of improving yields of the sensor and reducing the cost of the sensor.

Figure 8:
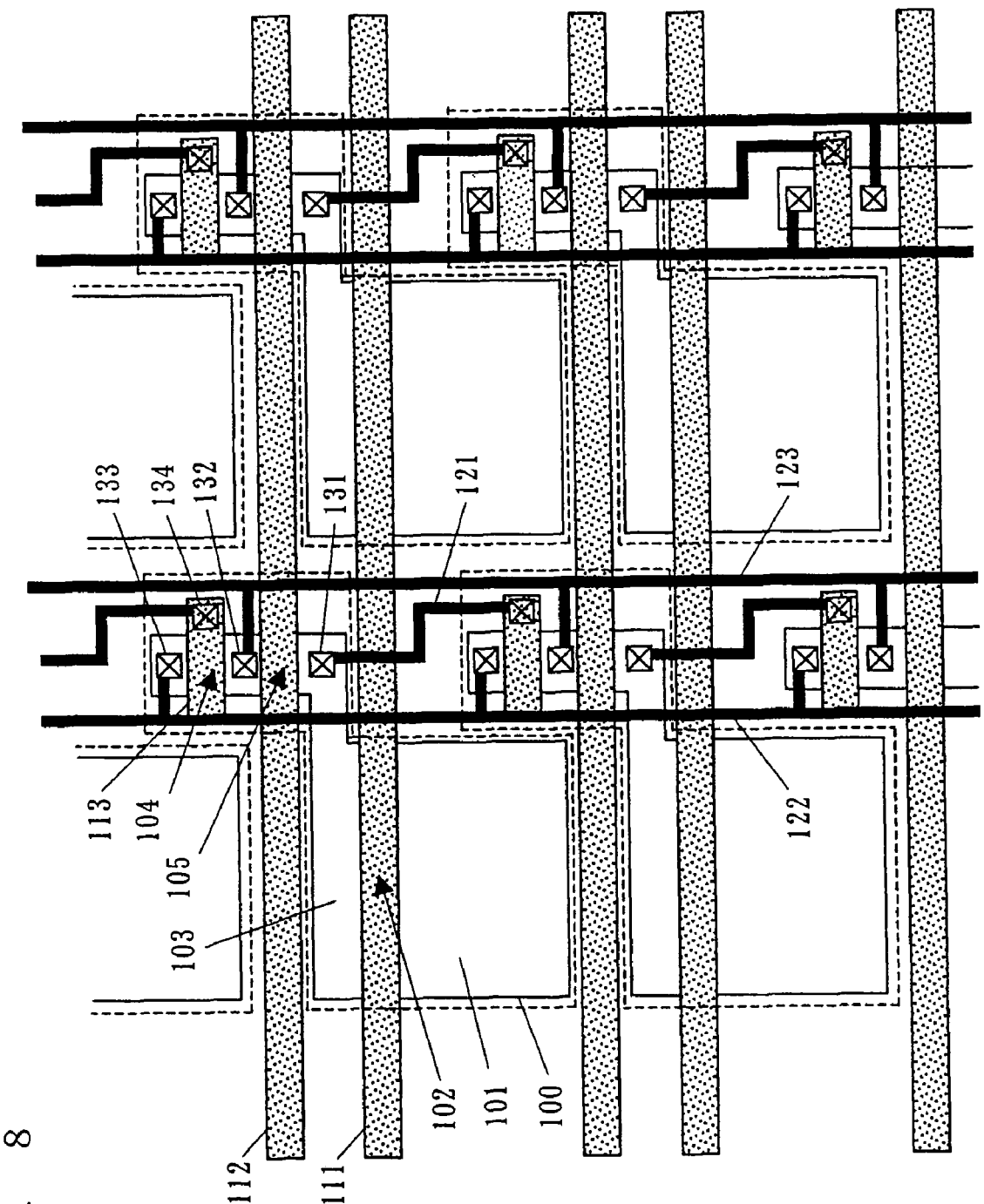
FIG. 8 is a diagram illustrating another layout of the sensor according to the embodiment of the present invention.

FIG. 8 is an illustration showing another layout pattern of the photosensitive cells illustrated in FIG. 6. The layout pattern of FIG. 8 is different from that of FIG. 7 in the following point. That is, in the layout pattern illustrated in FIG. 7, the four contact holes 131 through 134 included in each photosensitive cell are aligned approximately in one straight line. By contrast, in the layout pattern illustrated in FIG. 8, of the four contact holes 131 through 134 included in each photosensitive cell, three contact holes 131 through 133 are aligned approximately in one straight line, but the contact hole 134 is out of this straight line. Depending on the design rules applied for layout of the sensor, the layout illustrated in FIG. 8 can be employed.

In the sensor according to the embodiment, all of the transistors included in each photosensitive cell are preferably N-channel MOS transistors because of the following reason. In recent years, with a large majority of logic circuits being manufactured by using CMOS, MOS-type solid-state imaging devices are also often manufactured by using CMOS. Since a CMOS process for logic circuits includes a large number of complex processes, it is extremely difficult to change even a part of these processes only for the purpose of manufacturing the sensor. Therefore, in order to manufacture the sensor, an additional process unique to the sensor has to be added to the existing manufacturing processes. In this case, boron, which is a p-type impurity, is light in mass and is freely movable, and therefore is difficult to be made small inside the semiconductor. In consideration of this, it is advantageous to use only NMOS in the process unique to manufacturing of the sensor.

As described in the foregoing, according to the sensor of the embodiment of the present invention, by adopting a new circuit configuration for achieving a suitable layout, it is possible to reduce the size of the photosensitive cells, thereby reducing the size of the entire sensor.

While the invention has been described in detail, the foregoing description is in all aspects illustrative and not restrictive. It is understood that numerous other modifications and variations can be devised without departing from the scope of the invention.

What is claimed is:

1. A solid-state imaging device, comprising:
a plurality of photodiodes configured to perform optical-electrical conversion, each of the photodiodes being two-dimensionally arranged in row and column directions on a semiconductor substrate;
a plurality of transfer gates configured to transfer a signal electric charge obtained from performing the optical-electrical conversion, each of the transfer gates being provided on the semiconductor substrate for a corresponding one of the photodiodes;
a plurality of floating diffusion layers configured to temporarily store the transferred signal electric charge, each of the floating diffusion layers being provided for at least one of the corresponding photodiodes and at least one of the corresponding transfer gates;
an amplifier transistor configured to amplify the signal electric charge supplied to a gate thereof; the amplifier transistor being provided on the semiconductor substrate;
a reset transistor configured to reset the signal electric charge stored in the floating diffusion layer, the reset transistor being provided on the semiconductor substrate;
a vertical signal line configured to output a signal corresponding to the signal electric charge in the floating diffusion layer,
a signal line connecting a floating diffusion layer with a gate of an amplifier transistor, the signal line including a portion disposed in a column direction;
a first contact configured to receive an output of a source of the amplifier transistor;
a second contact connected to a drain of the reset transistor; and
a third contact connected to a source of the reset transistor,
wherein a gate of the amplifier transistor is connected, in the column direction, to at least one of the plurality of floating diffusion layers,
the gate of the amplifier transistor and the floating diffusion layer connected thereto are formed in different active regions respectively, and
the first, second, and third contacts are aligned in a straight line.

2. The solid-state imaging device according to claim 1, wherein the signal line includes a straight portion disposed in the column direction.

3. The solid-state imaging device according to claim 1, wherein the signal line includes a portion disposed in a direction traversing column direction.

4. The solid-state imaging device according to claim 1, wherein the signal line includes a straight portion disposed in a first column direction and another portion disposed in a direction traversing the column direction, and
the straight portion is connected to the associated floating diffusion layer.

5. The solid-state imaging device according to claim 1, wherein the amplifier transistor and the reset transistor share a common drain.

6. The solid-state imaging device according to claim 1, wherein transfer gates corresponding to adjacent photodiodes for a given row of photodiodes are formed by a continuous conducting material.

7. The solid-state imaging device according to claim 1, wherein the signal line and the vertical signal line are formed in a same metal wire layer.

8. The solid-state imaging device according to claim 1, wherein the signal line and the vertical signal line are arranged in parallel to each other.

9. A solid-state imaging device, comprising:
a plurality of photodiodes configured to perform optical-electrical conversion, each of the photodiodes being two-dimensionally arranged in row and column directions on a semiconductor substrate;

a plurality of transfer gates configured to transfer a signal electric charge obtained from performing the optical-electrical conversion, each of the transfer gates being provided on the semiconductor substrate for a corresponding one of the photodiodes;

a plurality of floating diffusion layers configured to temporarily store the transferred signal electric charge, each of the floating diffusion layers being provided for at least one of the corresponding photodiodes and at least one of the corresponding transfer gates;

an amplifier transistor configured to amplify the signal electric charge supplied to a gate thereof; the amplifier transistor being provided on the semiconductor substrate;

a reset transistor configured to reset the signal electric charge stored in the floating diffusion layer, the reset transistor being provided on the semiconductor substrate;

a vertical signal line configured to output a signal corresponding to the signal electric charge in the floating diffusion layer;

a signal line connecting a floating diffusion layer with a gate of an amplifier transistor, the signal line including a portion disposed in a column direction;

a first contact configured to receive an output of a source of the amplifier transistor;

a third contact connected to a source of the reset transistor; and a fourth contact configured to supply an input to a drain of the amplifier transistor, wherein a gate of the amplifier transistor is connected, in column direction, to at least one of the plurality of floating diffusion layers, the gate of the amplifier transistor and the floating diffusion layer connected thereto are formed in different active regions respectively, and the first, third, and fourth contacts are aligned in a straight line.

10. The solid-state imaging device according to claim 9, wherein the signal line includes a straight portion disposed in the column direction.

11. The solid-state imaging device according to claim 9, wherein the signal line includes a portion disposed in a direction traversing column direction.

12. The solid-state imaging device according to claim 9, wherein the signal line includes a straight portion disposed in a first column direction and another portion disposed in a direction traversing column direction, and the straight portion is connected to the associated floating diffusion layer.

13. The solid-state imaging device according to claim 9, wherein the amplifier transistor and the reset transistor share a common drain.

14. The solid-state imaging device according to claim 9, wherein transfer gates corresponding to adjacent photodiodes for a given row of photodiodes are formed by a continuous conducting material.

15. The solid-state imaging according to claim 9, wherein the signal line and the vertical signal line are formed in a same metal wire layer.

16. The solid-state imaging device according to claim 9, wherein the signal line and the vertical signal line are arranged in parallel to each other.

* * * * *